United States Patent [19]

Rogers, Jr. et al.

[11] Patent Number: 5,135,554
[45] Date of Patent: Aug. 4, 1992

[54] METHOD AND APPARATUS FOR CONTINUOUS SPUTTER COATING OF FIBERS

[75] Inventors: Harvey N. Rogers, Jr., Playa del Rey; Jacques F. Linder, Palos Verdes; Nicholas Cook, II, Chino, all of Calif.

[73] Assignee: Hughes Aircraft Company, Los Angeles, Calif.

[21] Appl. No.: 702,545

[22] Filed: May 20, 1991

[51] Int. Cl.$^5$ .............................................. C03C 25/04
[52] U.S. Cl. ........................................ 65/3.3; 65/3.31; 65/11.1; 118/50.1; 204/298.06; 427/45.1
[58] Field of Search .................. 65/3.3, 3.31, 11.1; 118/50.1; 204/298.06; 427/45.1

[56] References Cited

U.S. PATENT DOCUMENTS

| | | | |
|---|---|---|---|
| 4,726,822 | 2/1988 | Cates et al. | 65/3.31 X |
| 4,842,704 | 6/1989 | Collins et al. | 204/298.06 X |
| 5,006,218 | 4/1991 | Yoshida et al. | 204/298.06 |

FOREIGN PATENT DOCUMENTS

| | | | |
|---|---|---|---|
| 57-205335 | 12/1982 | Japan | 65/3.3 |
| 58-168002 | 10/1983 | Japan | 65/3.3 |
| 59-7350 | 2/1984 | Japan | 65/3.3 |

Primary Examiner—Robert L. Lindsay
Attorney, Agent, or Firm—M. E. Lachman; W. J. Streeter; W. K. Denson-Low

[57] ABSTRACT

Apparatus and method for continuously forming sputter-coated glass fibers. The apparatus includes a sputter vessel into which freshly drawn fiber is passed before surface contamination can occur. The sputter vessel includes modular sputtering units which are arranged to provide sputter deposition of one or more coatings onto the fiber or capillary tube as it passes through the sputter vessel. Roughing chambers may be provided on either end of the sputter vessel and include orifices sized to allow passage of the fiber through the orifice without contact. An improved sputter coating apparatus is also disclosed.

16 Claims, 3 Drawing Sheets

METHOD AND APPARATUS FOR CONTINUOUS SPUTTER COATING OF FIBERS

BACKGROUND OF THE INVENTION

1. Field of the Invention

The present invention relates generally to apparatus and methods for forming fibers and capillary tubing which have a protective coating. More particularly, the present invention relates to apparatus and methods for continuously forming glass fibers or capillary tubing and immediately protecting the glass surface with a sputter deposited coating of metal, metal alloy or other protective material. The present invention also relates to an improved sputter coating apparatus.

2. Description of Related Art

Glass fibers and capillary tubings are widely used in applications ranging from optical communication systems to analytical equipment such as gas chromatographs. Glass fibers are widely used as optical waveguides because they can be formed with specific optical qualities and physical characteristics. Due to the wide variety of environments to which fiber optical waveguides are exposed, it is important in many instances that the fiber surface be coated with a protective material. In particular, the fiber surface must be protected from moisture which would degrade the strength of the fiber. The protective coatings range from metals and metal alloys to various oxides and polymers.

Glass capillary tubing is also widely used in a number of applications. One common use for glass capillary tubing is for gas chromatograph columns. Protective coatings applied to the glass capillaries provide increased strength. This feature is particularly important with respect to gas chromatography columns which are typically over 100 meters long and require frequent handling during installation and removal from chromatography units.

The molten dip method is a common procedure used to coat glass fibers or capillary tubings with a protective metal layer. The molten dip method involves continuously pulling the fiber through a molten pool of metal immediately after it emerges from the drawing furnace. The molten pool of metal is located sufficiently close to the emerging fiber so that the pristine glass fiber surface does not become contaminated prior to coating with metal. This is important since it is undesirable to allow contaminants to form on the glass surface prior to application of the protective coating.

The molten dip method is well suited for its intended purpose; however, the method is limited in utility because only materials having a melting temperature below the melting point of the glass can be utilized. Additionally, the molten form of the metal or other coating material must possess the appropriate surface tension and adhesion properties to achieve a uniform hermetic seal. Another problem with the application of a molten layer to the glass fiber or capillary tubing is the high microbend induced optical attenuation which results from the large thermomechanical stresses created during the coating process.

In view of the above considerations, it would be desirable to provide an alternative process for applying protective coatings to glass fibers or capillaries wherein the limitations of the molten dip method are eliminated while still providing immediate and continuous coating of the glass fiber as it is formed.

SUMMARY OF THE INVENTION

In accordance with the present invention, a system is provided for manufacturing continuous lengths of fiber or capillary tubing wherein the surface of the fiber or tubing is continually sputter coated with a protective material. The sputter coating in accordance with the present invention is continuously applied to the fiber or tubing immediately after formation so that substantially no contamination of the pristine fiber or tubing surface occurs. A wide variety of protective coatings may be sputtered onto the fiber or tubing irrespective of the melting temperature for the protective material. Accordingly, the present invention provides the advantages of the molten dip method with respect to immediate coating of the drawn fiber or tubing, while at the same time providing all the advantages available in connection with sputter coating.

The apparatus for manufacturing continuous lengths of sputter coated fiber in accordance with the present invention includes fiber drawing means for continuously forming a fiber having a contaminant free surface. A sputter vessel having an inlet end, an outlet end and sidewalls which define a sputtering zone is located nearby the fiber drawing means. A surface located at the inlet end of the sputter vessel defines an inlet orifice through which the fiber is passed into the sputtering zone. The inlet orifice is located sufficiently close to the fiber drawing means so that the fiber surface is not contaminated prior to passage into the sputtering zone. The apparatus in accordance with the present invention further includes sputtering means located within the sputtering zone for applying a coating of sputtered material onto the fiber surface to provide a coated fiber. The coated fiber is passed out of the sputter vessel through an outlet orifice.

As a feature of the present invention, roughing chambers may be included on at least one end of the sputter vessel in order to provide adequate vacuum and atmosphere control within the sputtering zone so that the sputtering operation can be conducted efficiently. A further feature of the present invention involves sizing the inlet orifice with respect to the fiber diameter so that the fiber surface does not contact the inlet orifice as the fiber enters &:he sputtering vessel. It was discovered that adequate vacuum conditions within the sputtering zone could be maintained without requiring undesirable sealing contact between the inlet orifice and the glass fiber.

As another feature of the present invention, a plurality of modular sputtering units are located at spaced locations radially around the fiber within the sputtering zone. The spaced radial location of the modular sputtering units provides even distribution of sputtered material over the entire fiber surface. As a further feature of the present invention, the modular sputtering units are located at different axial locations within the sputtering zone so that different materials may be sputtered onto the fiber as it passes through the sputter vessel. This stacked arrangement of modular sputtering units provides for the application of more than one type of protective coating material.

Moreover, the present invention also provides an improved sputter coating apparatus comprising a sputter vessel and sputtering means within the sputter vessel wherein the sputtering means comprises at least two modular sputtering units at spaced locations radially around the substrate which provides uniform deposition of the sputter coating on the substrate. Alternatively, additional sputtering units may be provided at additional axial locations along the length of the substrate.

The above-discussed features and many other attendant advantages of the present invention will become better understood by reference to the following detailed description when taken in conjunction with the accompanying drawings.

DESCRIPTION OF THE PREFERRED EMBODIMENTS

The present invention is directed to a method and apparatus for continuously sputter coating fibers immediately after they are produced and prior to any contamination of the fiber surface. The following description is limited to the formation and coating of glass fibers and capillary tubings. However, it will be understood by those skilled in the art that the apparatus and method of the present invention have wide application to other fiber materials and protective coatings.

Figure 1:
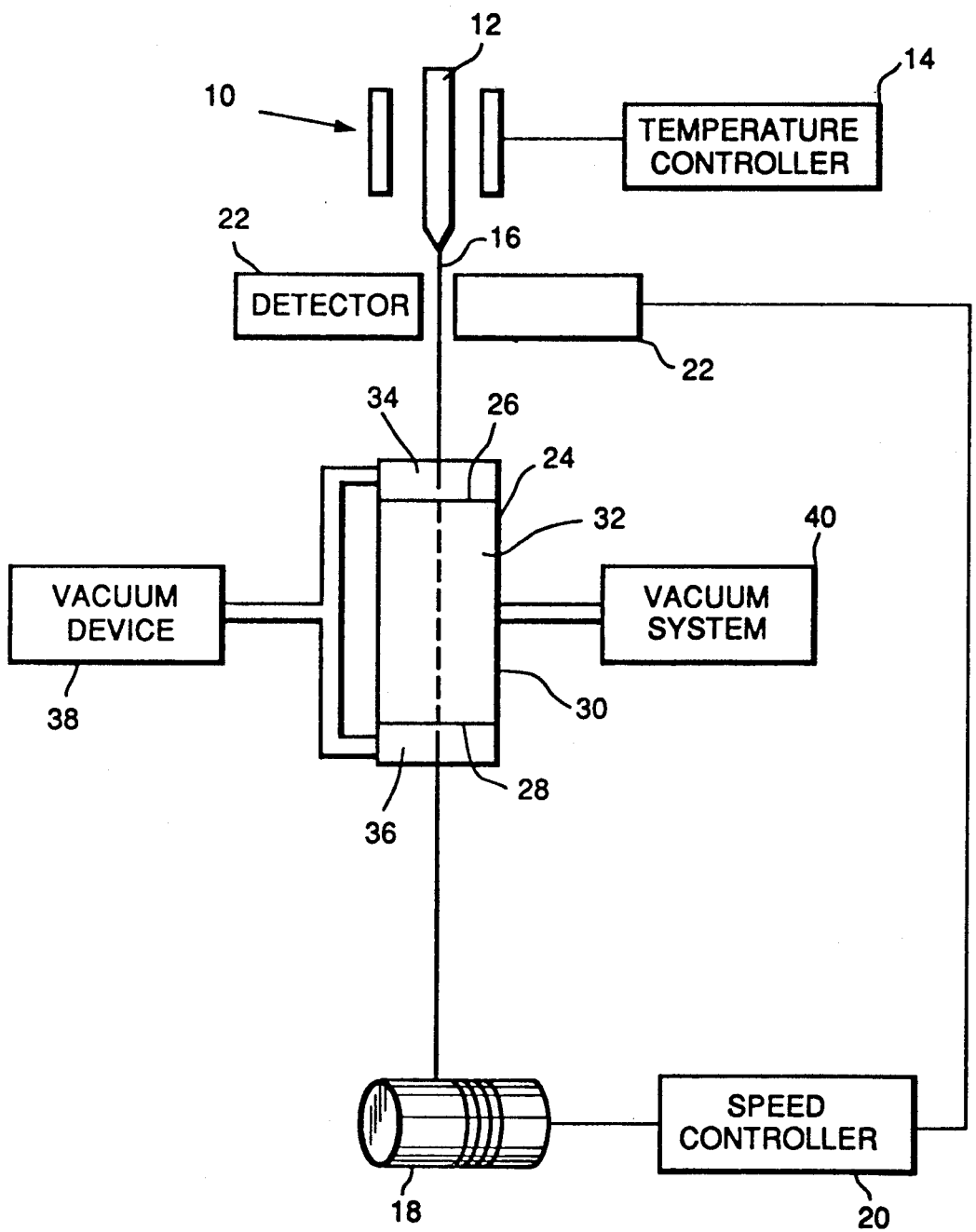
FIG. 1 is a schematic representation of a preferred exemplary apparatus for manufacturing continuous lengths of sputter coated fiber in accordance with the present invention.

A preferred exemplary apparatus in accordance with the present invention is shown in FIG. 1. The apparatus includes a drawing furnace 10 in which is located a molten glass preform 12. The temperature of the molten glass preform is controlled by temperature controller 14. The molten glass preform is drawn into a fiber 16 according to known procedures. In the discussion herein, the material to which the protective coatings are being applied by sputtering are referred to, for simplicity's sake, as a "fiber", and this term is intended to mean fiber and/or capillary tubing. The fiber 16 is connected to a take-up drum 18. The speed at which the fiber 16 is drawn from the molten preform 12 is controlled by the speed controller 20 which controls the speed at which the take-up drum rotates. The speed controller 20 is connected to a detector 22, such as laser micrometer. The detector 22 measures the diameter of fiber 16 and provides input into speed controller 20 whereby take-up drum 18 is rotated at a controlled speed to provide drawing of fiber 16 from the molten preform 12 at a speed which provides the desired diameter fiber 16. Typical fiber diameters are generally on the order of 500 micrometers or less. However, fiber diameters of up to 1000 micrometers are possible.

The sputter vessel in accordance with the present invention is shown schematically at 24 in FIG. 1. The sputter vessel 24 has an inlet end 26 and an outlet end 28 and sidewalls 30 which define a sputtering zone 32 through which the fiber 16 is passed for sputtering. Optional roughing chambers 34 and 36 are located at the inlet end and outlet end, respectively, of the sputter vessel 24. The roughing chambers 34 and 36 are connected to a high volume blower, such as a Roots blower, or other vacuum device 38 which creates a vacuum within roughing chambers 34 and 36. The roughing chambers 34 and 36 are designed as transition chambers through which the fiber 16 is passed as it transitions from atmospheric conditions to a vacuum environment and then back to atmospheric conditions in order to efficiently minimize oxygen contamination in the sputter chamber.

A turbo molecular pump or other vacuum system 40 is attached to the sputter vessel 24 to provide the vacuum conditions within the sputtering zone 32 necessary for sputtering operations.

In accordance with the present invention, it is important that the inlet end 26 of the sputter vessel 24 be located sufficiently close to the glass preform 12 so that contamination of the pristine fiber 16 does not occur after the glass fiber is formed and prior to its entry into the sputter vessel 24. Typical distances which have been used range from 6 to 12 inches between the exit point of the "fiber" from the furnace and its entrance into the vacuum chamber, but other distances may also be used. In addition, this region may be provided with a blanket of dry nitrogen or other inert gas to provide additional protection of the pristine fiber from contamination.

Figure 2:
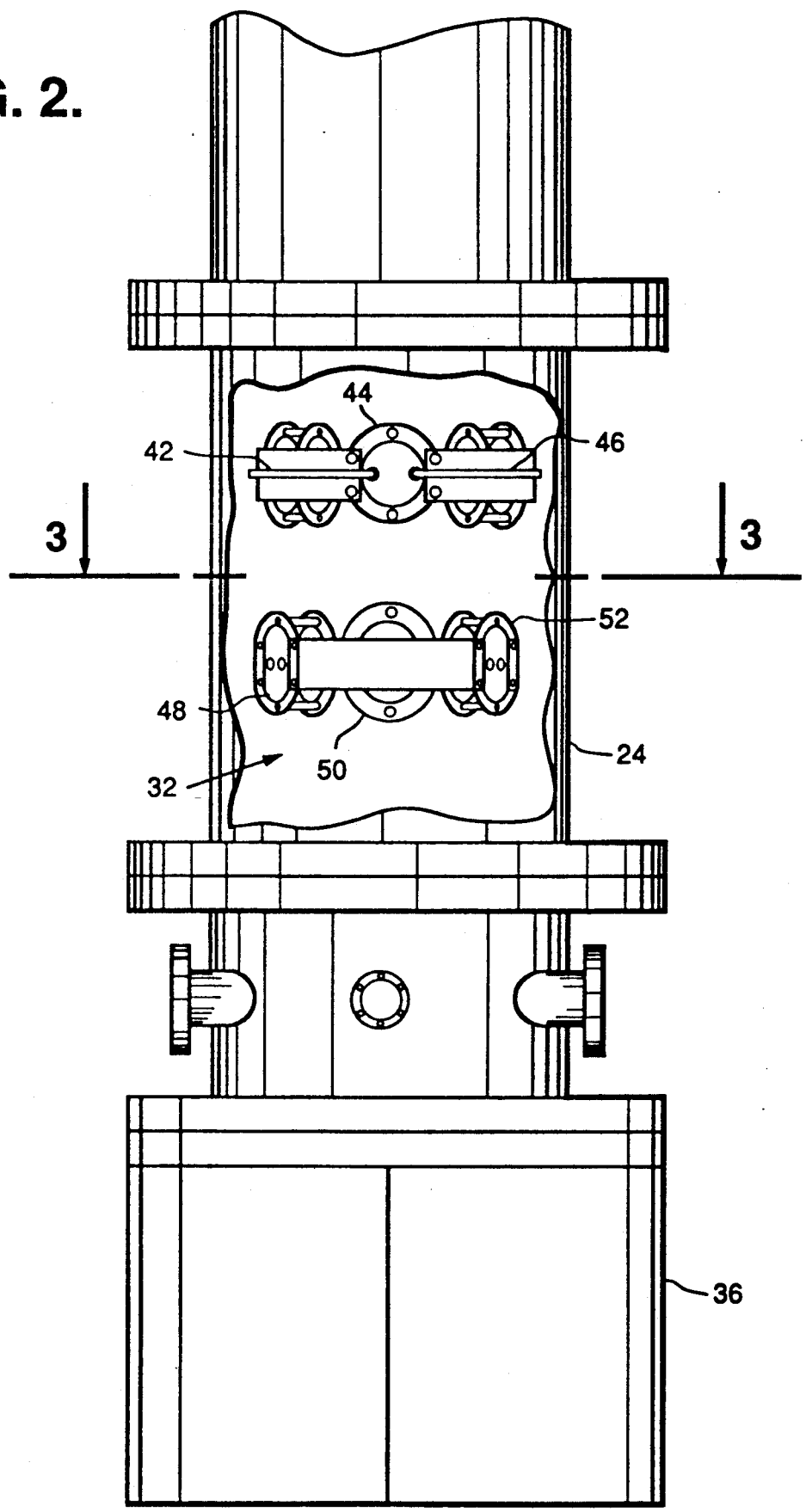
FIG. 2 is a partial detailed view of a preferred exemplary sputter vessel in accordance with the present invention.

A detailed view of the sputter vessel 24 is shown in FIG. 2. The roughing chamber 36 located at the outlet end of the sputter chamber is shown. The roughing chamber 34 located at the inlet end of the sputter vessel 24 is not shown. In a preferred embodiment, modular DC sputter cathode units are placed within the sputter zone 32. The sputtering units, as shown in FIG. 2 are arranged as a top row of three units 42, 44 and 46 and a bottom row of three units 48, 50 and 52. The DC sputter cathode units 42–52 are shown in greater detail in FIG. 3 herein. As many rows of sputtering units may be used as are required for the particular application. Two or more sputtering units may be used in each row.

The target material used for sputtering can be any of the conventional materials commonly used for sputter depositing a coating. Preferred sputter materials include metals, metal alloys and conductive ceramic materials. Typical examples include copper, aluminum, platinum, gold, nickel, chromium and Inconel (an alloy of nickel and chromium). It is preferred that the same metal or metal alloy be sputtered from each row of sputtering units. For example, sputtering units 42, 44 and 46 preferably include the same target metal so that a single material is sputtered onto the fiber as it passes by the top row of sputtering units. The bottom row of sputtering units 48, 50 and 52 may include the same target material or, alternatively, the bottom row of sputtering units may include a different target material. The use of a different target material in the bottom row of sputtering units than in the top row provides for the sequential application of layers of different materials to the glass fiber in a single process. For example, a thin layer of an adhesion promoter such as chromium or nickel can be deposited from the top row of sputtering units, followed by the deposition from the bottom row of sputtering units of a material such as gold or a noble metal which does not adhere well directly to glass. If different target materials are used in the same row, metals may be co-deposited to form alloys, or different materials may be deposited on opposite sides of the fiber. If the same target material is used in the top and bottom rows of sputtering units, the bottom row may be offset from the top row by 60 degrees for greater efficiency.

Figure 3:
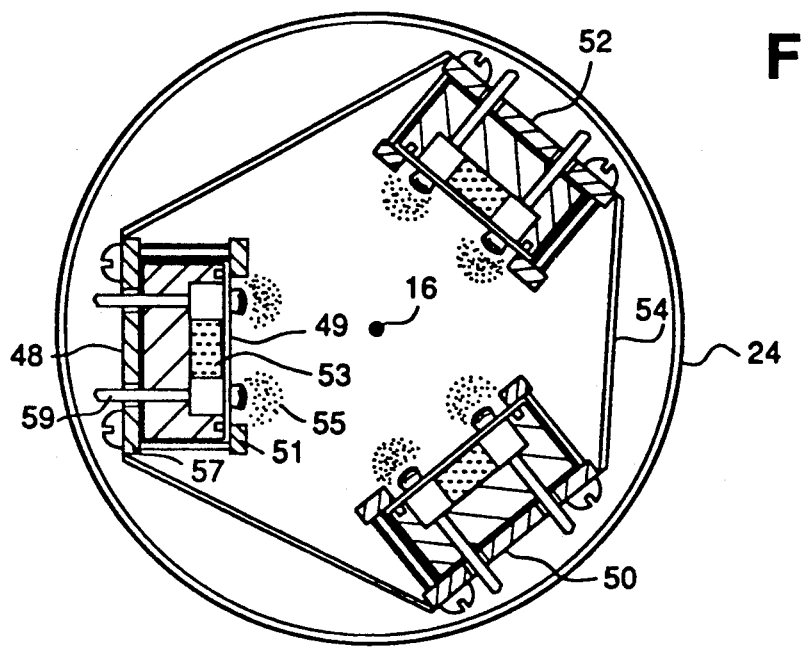
FIG. 3 is a sectional view of FIG. 2 taken in the 3—3 plane.

The bottom row of sputtering units 48, 50 and 52 is shown in FIG. 3 arranged around fiber 16. The sputtering units 48, 50 and 52 are attached to a vertical housing 54. The connection of the sputtering units to suitable power sources and cooling units is not shown since these connections are conventional. The preferred arrangement of sputtering units is three units spaced 120° apart radially around the fiber 16. The components of sputter unit 48, for example, are target cathode 49, anode 51, rare earth magnet 53 which produces magnetic field 55, backframe 57, and cooling tubes 59. The general designs of a DC sputter cathode unit using a magnet is known in the art, as described for example by Vosser and Kern, editors, in the book entitled "Thin Film Processes," Academic Press, Inc., Orlando, Fla., 1978, at pages 134–142. The sputtering units are placed as close as possible to the fiber in order to achieve high deposition rates. However, the sputtering units cannot be located so close to each other that arcing cf the plasma or similar problems in sustaining the plasma might occur.

Although DC sputter deposition is the preferred deposition technique, other sputtering processes may be utilized provided that a desired thin film is deposited on the fiber as it passes through the sputter zone. It is preferred that the vacuum within the sputtering zone 24 be on the order of 1 to 100 millitorr (1 to 100 mm Hg). During the sputtering process, the sputter zone is backfilled to a pressure of 10 to 50 millitorr (10 to 50 mm Hg) with a suitable sputter gas such as argon. The DC voltage to the sputtering units is set at a level to produce a plasma discharge resulting in sputter erosion of the target material in the cathode. The coating material is deposited onto the fiber as it is drawn through the sputter zone. A typical travel speed for the fiber is about 0.01 to 1 meters per second.

Figure 4:
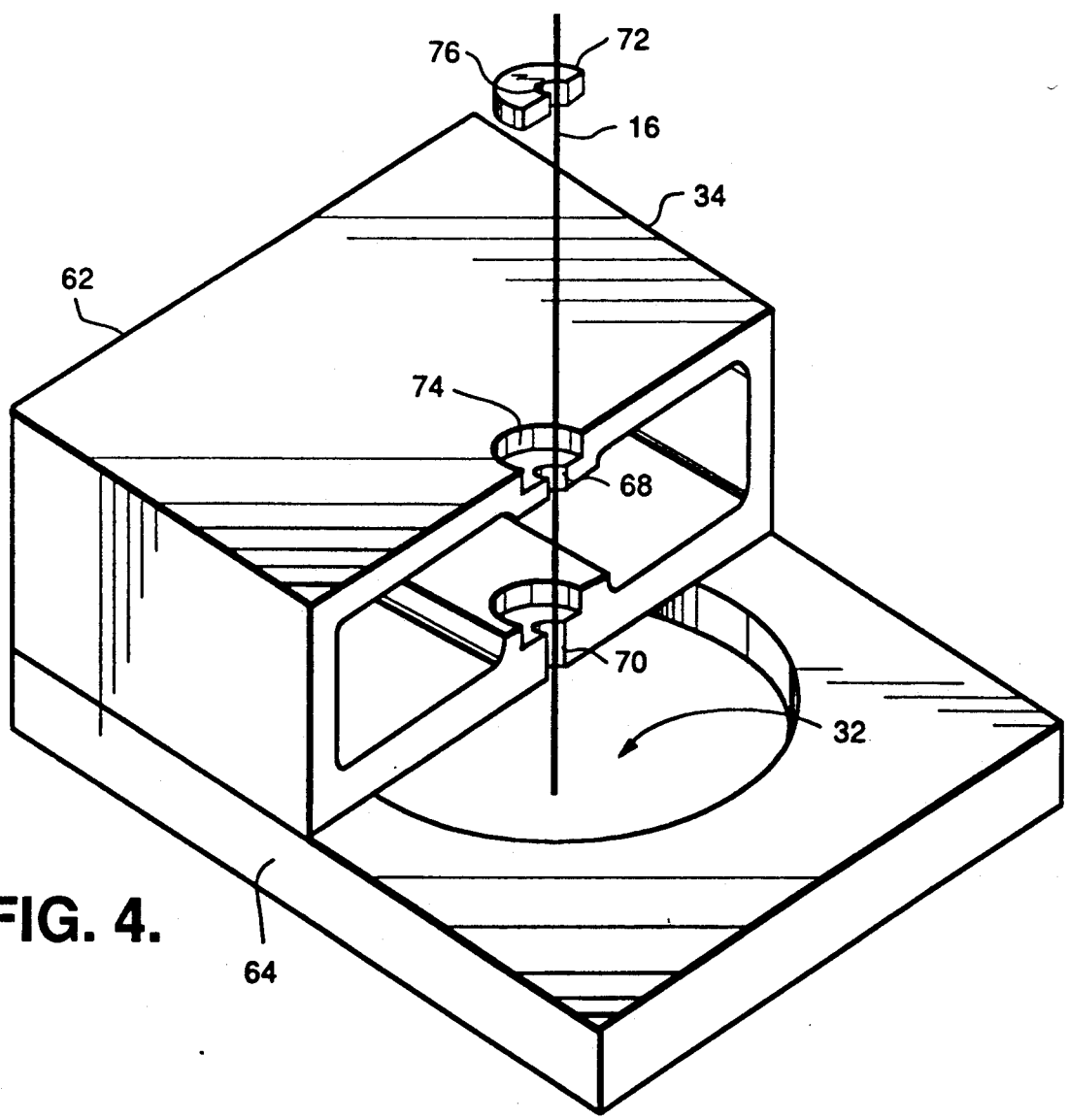
FIG. 4 is a perspective view of a preferred exemplary roughing chamber in accordance with the present invention.

A detailed view of the upper roughing chamber 34 is shown in FIG. 4. The roughing chamber 34 includes two "clam-shell" doors which are manually opened to allow threading of the glass fiber 16 through the roughing chamber into the sputtering zone 32. The two clamshell doors are identical with only one of the doors 62 being shown in FIG. 4. The clam-shell door 62 is attached to a mounting plate 64. The roughing chamber 34 includes openings 68 and 70 through which the glass fiber is passed. The openings 68 and 70 are much larger than the glass fiber being coated.

In accordance with the present invention, an insert 72 is provided which is sized to fit within a mounting hole 74 present in the top of the roughing chamber 34. The insert 72 is a two-piece structure which fits together to provide a centrally located orifice 76. The orifice is chosen to be slightly larger than the diameter of the glass fiber being treated. The diameter of the orifice is chosen so that the annular gap existing between the insert and fiber is sufficiently small to allow a vacuum to the formed in the roughing chamber while not being so small that the fiber contacts the insert as it is drawn into the roughing chamber. For example, orifices 76 having diameters of 200 micrometers can be used when treating fibers having diameters in the range of 150 to 190 micrometers. Preferably an annular gap of between about 10-20 micrometers will be present between the fiber 16 and the insert orifice 76.

The insert 72 is designed to be removably mounted within the mounting hole 74 on roughing chamber 34. Accordingly, inserts 72 having different orifice diameters 76 can be quickly interchanged to accommodate fibers of different diameter sizes and different shapes.

The inserts 72 are preferably made from low surface friction materials such as polytetrafluoroethylene.

As an example of practice of the present invention, a copper coating was sputter deposited onto a glass fiber using the apparatus depicted in the Figures herein. The diameter of the fiber was 190 micrometers. The diameter of orifice 76 in the upper roughing chamber and the diameter of the orifice in the lower roughing chamber was 200 micrometers. The roughing chambers and sputtering zone were evacuated to a base vacuum of approximately $5 \times 10^{-4}$ torr ($53 \times 10^4$ mm Hg). Argon was admitted into the sputtering zone to maintain a pressure of 40 to 50 millitorr (4 to $5 \times 10^{-6}$ mm Hg). A DC voltage of 277 volts at a current of 0.20 amperes was applied to the sputter electrodes 42-52. The glass fiber extended in one end of the sputter vessel and out the other through the respective orifices. After 20 minutes of deposition, the fiber was removed for analysis and found to have a coating of 5.2 micrometers copper with a 6% variation in thickness circumferentially around the fiber.

In another example of the present invention, a glass fiber having a diameter of 175 micrometers was coated with copper using the same apparatus described in the previous example including inserts having orifices with a 200 micrometers diameter. A DC voltage of 308 volts at 0.5 amperes was applied to the sputter electrodes. The fiber was passed through the sputtering chamber at a rate of one inch (2.54 cm) per minute. After 30 minutes, the fiber was inspected and found to have a continuous coating of copper extending over the entire length of the fiber passed through the sputtering chamber.

In another example, the same apparatus is used to provide a copper coating on a freshly formed glass fiber. The sputter vessel is placed immediately adjacent to the freshly formed glass fiber so that the fiber enters the sputter vessel prior to any contamination forming on the fiber surface.

The coatings formed in accordance with the present invention produce hermetic sealing of the fibers or capillary tubing, which produces improved performance characteristics, as discussed in further detail below. Moreover, the apparatus of the present invention is compatible with conventional glass fiber draw towers without modification of the furnace, preform feed mechanism, or fiber take-up mechanism. In addition, the design of the apparatus allows faster processing, greater compatibility with different draw tower systems, and easier operation than known systems for coating fibers. Further, the present invention enables fibers to be coated with a wide variety of materials that were not capable of being deposited by known techniques. The coatings formed by the present invention have uniform thickness and are formed at ambient temperatures, thus avoiding the use of excessive heat. In addition, since the present process is performed on-line as the fiber is drawn, the detrimental effects of excessive exposure to air, moisture, and other contaminants are minimized and the intrinsic high strength of the glass is preserved. The improved performance characteristics of the coated fibers formed in accordance with the present invention include, but are not limited to, operation at high temperature, resistance to corrosive chemical environments, resistance to thermal and/or mechanical cyclic fatigue, ability to conduct an electrical current or electronic signal by means of a conductive coating, ability to be soldered or brazed for packaging applications, chemical and physical compatibility with certain metal matrix composite materials, and ability to achieve lower microbend induced optical attenuation.

Furthermore, while the previous discussion has been limited to an apparatus and method for sputter coating fibers, the present invention is not so limited. In particular, the sputtering means of the present invention comprising two or more modular sputtering units located within the sputter vessel at spaced locations radially around the substrate may be used to sputter deposit a uniform coating of a chosen material on any substrate. In an alternative embodiment, multiple rows of sputtering units may be located at different axial locations along the length of the substrate. A variety of materials and material combinations may be sputter deposited on the substrate as previously described herein.

Having thus described exemplary embodiments of the present invention, it should be noted by those skilled in the art that the disclosures within are exemplary only and that various other alternatives, adaptations and modifications may be made within the scope of the present invention. Accordingly, the present invention is not limited to the specific embodiments as illustrated herein, but is only limited by the following claims.

What is claimed is:

1. An apparatus for manufacturing continuous lengths of sputter coated fiber, said apparatus comprising:
   fiber drawing means for continuously forming a fiber having a contaminant free surface;
   a sputter vessel having an inlet end, an outlet end and side walls which define a sputtering zone;
   a surface located at the inlet end of said sputter vessel which defines an inlet orifice through which said fiber is passed into said sputtering zone, said inlet orifice being located sufficiently close to said fiber drawing means so that said fiber passing through said inlet orifice from said fiber drawings means is substantially contaminant free;
   sputtering means located within said sputtering zone for applying a coating of sputtered material onto said fiber surface to provide a coated fiber, wherein said sputtering means includes at least two modular sputtering units located at spaced locations radially around said fiber as said fiber passes through said sputtering zone, and each said modular sputtering unit comprises a target cathode facing said fiber surface, an anode, and a magnet; and
   a surface located at the outlet end of said sputter zone defining an outlet orifice through which said coated fiber is passed out of said sputtering zone.

2. An apparatus for manufacturing continuous lengths of sputter coated fiber according to claim 1 wherein said inlet orifice does not contact the contaminant free surface of said fiber.

3. An apparatus for manufacturing continuous lengths of sputter coated fiber according to claim 1 wherein said sputter vessel includes a roughing chamber located at the inlet end of said sputter vessel through which said fiber is passed prior to entry into said sputtering zone.

4. An apparatus for manufacturing continuous lengths of sputter coated fiber according to claim 3 wherein said sputter vessel includes a roughing chamber located at the outlet end of said sputter vessel through which said coated fiber is passed from said sputtering zone.

5. An apparatus for manufacturing continuous lengths of sputter coated fiber according to claim 1 wherein said sputtering means includes three modular sputtering units located at spaced locations radially around said fiber as said fiber passes through said sputtering zone.

6. An apparatus for manufacturing continuous lengths of sputter coated fiber according to claim 1 wherein said modular sputtering units are spaced radially around said fiber at more than one axial location as said fiber passes through said sputtering zone.

7. An apparatus for manufacturing continuous lengths of sputter coated fiber according to claim 6 wherein said modular sputtering units at different axial locations provide sputtering of different materials onto the surface of said fiber to produce a coating comprised of more than one sputtered material.

8. An apparatus for manufacturing continuous lengths of sputter coated fiber according to claim 1 wherein said inlet orifice is present in an orifice insert which is removably mounted to said sputter vessel.

9. An apparatus for manufacturing continuous lengths of sputter coated fiber according to claim 1 wherein said fiber drawing means includes means for drawing a glass fiber from a molten glass preform.

10. A method for manufacturing continuous lengths of sputtered coated fiber comprising the steps of:
    forming a fiber having a contaminant free surface;
    passing said fiber through an inlet orifice into a sputter vessel having an inlet end, outlet end and side walls defining a sputtering zone, said contaminant free fiber being passed sufficiently quickly into said sputter vessel to prevent contaminants from forming on said contaminant free surface;
    sputter depositing a coating of a chosen material onto said contaminant free surface to form a coated fiber, wherein said sputter depositing is performed by at least two modular sputtering units located at spaced locations radially around said fiber as said fiber is passed through said sputtering zone, and each said modular sputtering unit comprises a target cathode facing said fiber, an anode, and a magnet; and
    passing said coated fiber from said sputtering zone through an outlet orifice.

11. A method for manufacturing continuous lengths of sputter coated fiber according to claim 10 wherein the contaminant free surface of said fiber does not touch said inlet orifice as said fiber is passed into said sputtering zone.

12. A method for manufacturing continuous lengths of sputter coated fiber according to claim 10 wherein said sputtered material is coated onto said contaminant free fiber surface by three modular sputtering units.

13. A method for manufacturing continuous lengths of sputter coated fiber according to claim 10 wherein said modular sputtering units are spaced radially around said fiber at more than one axial location as said fiber passes through, said sputtering zone.

14. A method for manufacturing continuous lengths of sputter coated fiber according to claim 13 wherein more than one material is sputter coated onto said fiber.

15. A method for manufacturing continuous lengths of sputter coated fiber according to claim 10 wherein said fiber is formed by drawing from a molten pool of glass.

16. A method for manufacturing continuous lengths of sputter coated fiber according to claim 10 wherein said chosen material comprises a metal, metal alloy or conductive ceramic.

* * * * *